US010413850B2

(12) United States Patent
Taddei et al.

(10) Patent No.: US 10,413,850 B2
(45) Date of Patent: Sep. 17, 2019

(54) APPARATUS AND METHOD TO REMOVE SOLIDS FROM MATERIAL LIFT OFF POST PROCESS SOLVENTS

(71) Applicant: VEECO PRECISION SURFACE PROCESSING LLC, Horsham, PA (US)

(72) Inventors: John Taddei, Jim Thorpe, PA (US); Paul Vit, Horsham, PA (US); Kenji Nulman, Warminster, PA (US); Jim Anders, Horsham, PA (US)

(73) Assignee: VEECO PRECISION SURFACE PROCESSING LLC, Horsham, PA (US)

( * ) Notice: Subject to any disclaimer, the term of this patent is extended or adjusted under 35 U.S.C. 154(b) by 51 days.

(21) Appl. No.: 15/874,617

(22) Filed: Jan. 18, 2018

(65) Prior Publication Data

US 2018/0207562 A1 Jul. 26, 2018

Related U.S. Application Data

(60) Provisional application No. 62/448,153, filed on Jan. 19, 2017.

(51) Int. Cl.
*B01D 35/28* (2006.01)
*B08B 3/04* (2006.01)
*B01D 29/085* (2006.01)
*B08B 15/04* (2006.01)
*B01D 11/02* (2006.01)
*B08B 3/08* (2006.01)
*B01D 29/27* (2006.01)
*B01D 29/52* (2006.01)
*H01L 21/67* (2006.01)

(52) U.S. Cl.
CPC .......... *B01D 35/28* (2013.01); *B01D 11/0203* (2013.01); *B01D 23/28* (2013.01); *B01D 29/27* (2013.01); *B01D 29/52* (2013.01); *B08B 3/047* (2013.01); *B08B 3/08* (2013.01); *B08B 15/04* (2013.01); *B01D 11/0292* (2013.01); *H01L 21/67086* (2013.01)

(58) Field of Classification Search
CPC ............ B01D 11/0203; B01D 11/0292; B01D 23/28; B01D 29/27; B01D 29/52; B01D 35/28; B08B 15/04; B08B 3/047; B08B 3/08; H01L 21/67086
See application file for complete search history.

(56) References Cited

U.S. PATENT DOCUMENTS

| 6,814,876 | B1 | 11/2004 | Neal |
| 9,789,428 | B1 | 10/2017 | Porter et al. |
| 2008/0277357 | A1 | 11/2008 | Svetlik, III |
| 2014/0305886 | A1 | 10/2014 | Taddei et al. |
| 2015/0047674 | A1 | 2/2015 | Goodman et al. |

*Primary Examiner* — Dirk R Bass
(74) *Attorney, Agent, or Firm* — Leason Ellis LLP

(57) ABSTRACT

An apparatus and method for removing post MLO (Material Lift Off) materials from a recycle solvent stream utilize a space efficient design and in a fashion that greatly reduces equipment downtime to maintenance and in a health friendly fashion.

20 Claims, 6 Drawing Sheets

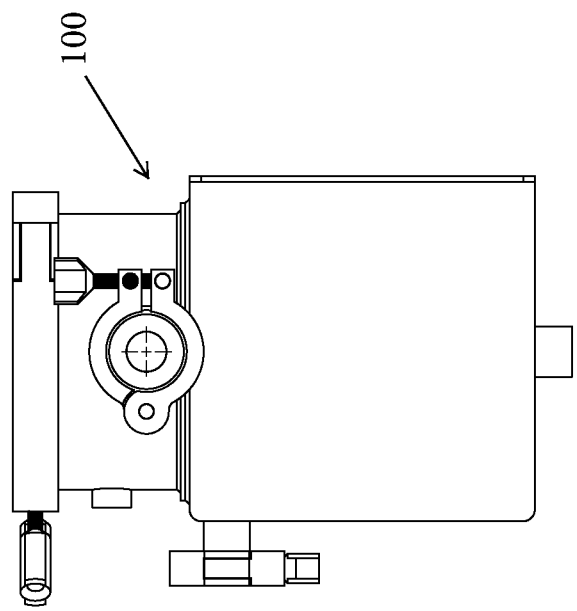
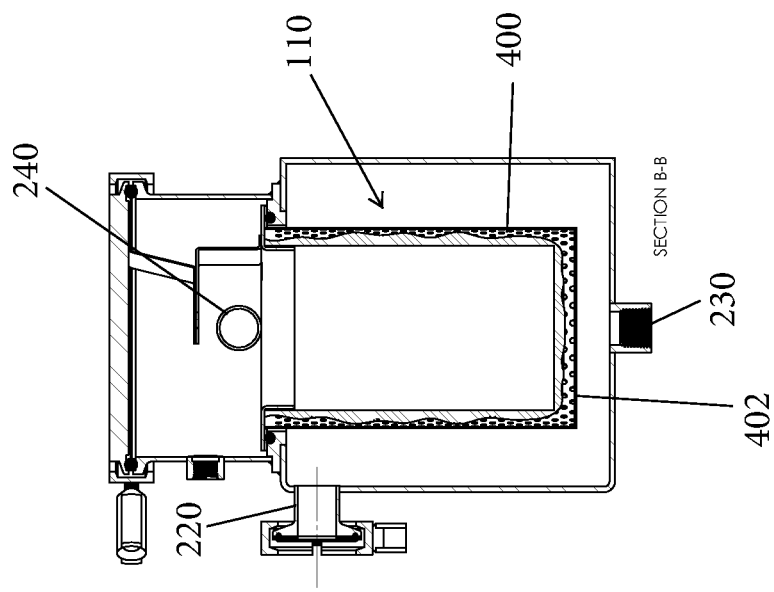
Fig. 6
Fig. 5

APPARATUS AND METHOD TO REMOVE SOLIDS FROM MATERIAL LIFT OFF POST PROCESS SOLVENTS

CROSS-REFERENCE TO RELATED PATENT APPLICATIONS

This application is based on and claims priority to U.S. Provisional Patent Application No. 62/448,153, filed Jan. 19, 2017, the entire contents of which is incorporated by reference herein as if expressly set forth in its respective entirety herein.

TECHNICAL FIELD

This invention generally relates to an apparatus and method for removal of solid material from a liquid. More specifically, this invention relates to an apparatus and method for removing post MLO (Material Lift Off) materials from a recycle solvent stream utilizing a space efficient design and in a fashion that greatly reduces equipment downtime to maintenance and in a health friendly fashion.

BACKGROUND

Material Lift Processes (MLO) are commonly used in semiconductor manufacturing to remove undesired material. This step is employed when wet chemistries, such as aggressive etchants, would attack the substrate itself or attack other exposed materials in the film stack that are desired to be left unchanged. The sequence to perform the MLO is to apply Photo resist to a substrate (circuit board or wafer) and then expose with light through a mask. The photo resist is then developed via exposure to a chemistry that will remove a portion of the resist. The result is a substrate partially protected by photo resist and partially exposed. The substrate then sees material deposition (metal, dielectric . . . ) across the entire wafer surface. This added film adheres in locations to the substrate and in other locations to the photo resist. At this point the MLO step occurs. Solvents are typically employed to swell and then remove the resist from the substrate. During this step, the deposited film (metal, etc.) that was deposited on the photo resist also is removed when the resist is removed. The deposited film that adhered to the substrate remains in place. The solvent is typically collected for re-use. Post MLO, the substrate is rinsed and then dried. The substrate is ready for the next step in the manufacturing process.

The metal (material) that was removed (or lifted off) is rinsed from the wafer surface with pressurized solvent. This metal is left to follow the drain path of the recycled solvent. In cases this metal is in large pieces and will be caught by large mesh strainers within the process chamber. Those pieces of metal smaller than a chamber drain screen mesh (or all materials if no drain screen is in the tool design) pass through the drain into the recycle chemistry loop. These materials will cause damage to hardware (such as pumps), clog filters and will cause yield loss on subsequent wafers processed (such as pitting or scratching) if not removed from the recycle solvent stream.

Historically strainers have removed the bulk of this lifted material from the solvent stream. The size and quantity of materials is dependent of the wafer design. In high volume manufacturing it is not uncommon for strainers to require maintenance several times per week. Properly designed and sized re-usable strainers will capture the majority of material and permit expensive, single use, low pore size filters to have lives of one or more months.

Maintenance to clean separated material from the strainers has historically required the tool to be shut down. Maintenance personnel have been required to remove, empty and clean the solvent wetted strainers on a routine basis. The industry has requested a no down time strainer design that is more efficient at removing materials that can cover a variety of pore sizes with a single design that requires less maintenance and that does not expose personnel to solvents.

SUMMARY

In one embodiment, an apparatus for filtering materials (metals, dielectrics, etc.) from post process MLO solvent in accordance with the present invention includes a welded enclosure containing isolated, tandem strainers. Each side of the tandem strainer weldment has a strainer housing to hold the strainer and the cleaned solvent that passes through it. An optional disposable bag filter (membrane) sits inside the strainer. There are liquid (solvents) inlets near the top and outlets at a lower elevation. There is also a secondary inlet (the purge port) for a rinsing agent (IPA or DI water) and drying medium (CDA or nitrogen). A drain opening is located at the bottom of each strainer housing. Each strainer housing has an O-ring sealed lid held in place by a clamp. The strainer\filter indexer ensures the strainer, bag filter, O-rings and lid are properly lined up to seal fluid paths and prevent fluid crossover. Fluid inlet\outlet pipes are connected to tool piping through a gasket and clamp.

Post process solvent is introduced into one side of the tandem strainer weldment through an inlet above one of the strainers. The solvent and metal mixture passes initially through a disposable bag type filter (optional) of small mesh size (typically 2-40 um). This filter is intended to capture the majority of material in the solvent. The bag filter sits within the strainer (typically 25-150 um mesh). Clean solvent passing through both filter and strainer can then flow through the liquid outlet. The inclusion of the bag filter decreases effective mesh size, increases collection efficiency, extends downstream filter life and makes maintenance far easier by reducing magnitude of strainer cleaning. Strainers are twice as large as previous generation, doubling strainer life. The tandem design reduces footprint and permits exchanging bag filter while in operation (downtime eliminated). The rinse port permits rinsing and drying of the bag filter prior to exchange, thus eliminating exposure of maintenance personnel to solvents.

BRIEF DESCRIPTION OF THE DRAWING FIGURES

FIG. 5 is a cross-sectional view taken along the line B-B of FIG. 3;

FIG. 6 is a right side elevation view thereof;

DETAILED DESCRIPTION OF CERTAIN EMBODIMENTS

It is to be understood that the figures and descriptions of the present invention have been simplified to illustrate elements that are relevant for a clear understanding of the present invention, while eliminating, for the purposes of clarity, many other elements which may be found in the present invention. Those of ordinary skill in the pertinent art will recognize that other elements are desirable and/or required in order to implement the present invention. However, because such elements are well known in the art, and because such elements do not facilitate a better understanding of the present invention, a discussion of such elements is not provided herein.

FIGS. 1-8 illustrate an apparatus 100 for removing solids from material lift off post process solvents. In particular, the apparatus 100 and related method is configured to remove post MLO materials from a recycle solvent stream utilizing a space efficient design and in a fashion that greatly reduces equipment downtime to maintenance and in a health friendly manner as described in more detail below.

The apparatus 100 generally includes a first strainer device 110 and a second strainer device 120 that is independent from the first strainer device 110. As described herein, in one exemplary implementation of the present invention, it is intended that one of the first and second filter (strainer) devices 110, 120 be in an operating mode (straining the post MLO materials) while the other of the first and second filter devices 110, 120 be in an offline mode. However, the apparatus 100 is also configured such that both the first and second filter devices 110, 120 can be in an active operating mode due to each of the first and second filter devices 110, 120 being independent from one another and including dedicated plumbing as described herein.

Figure 7:
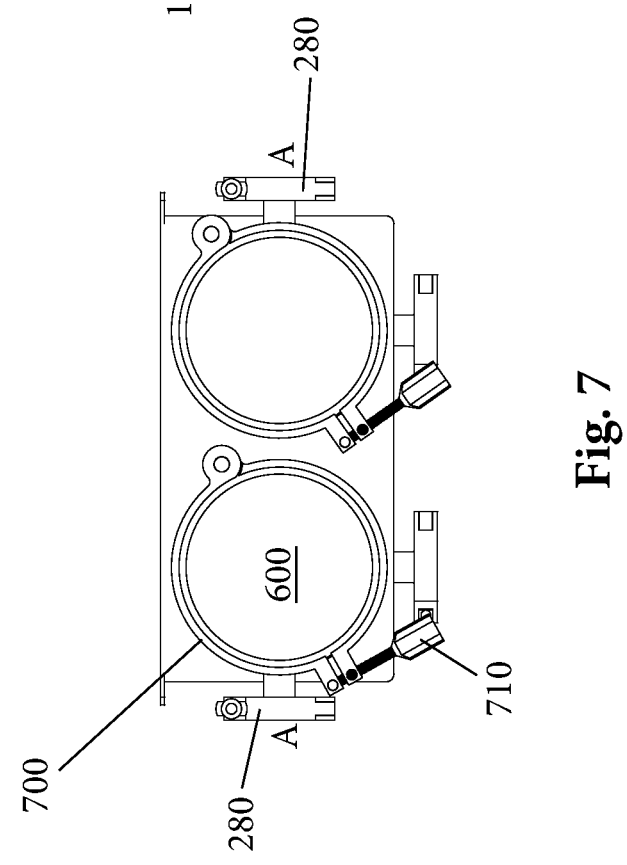
FIG. 7 is a top plan view thereof.
Figure 3:
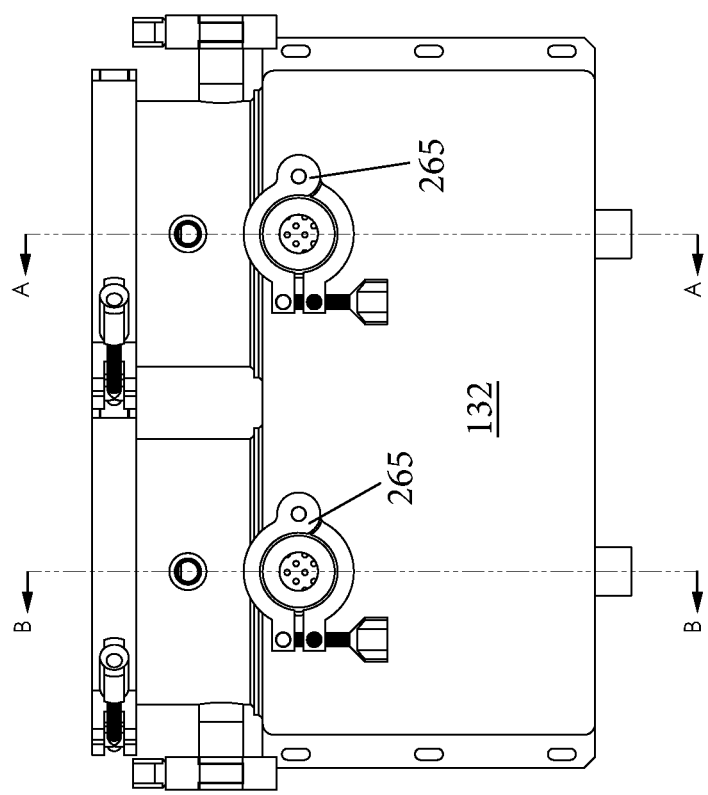
FIG. 3 is a front elevation view thereof.
Figure 8:
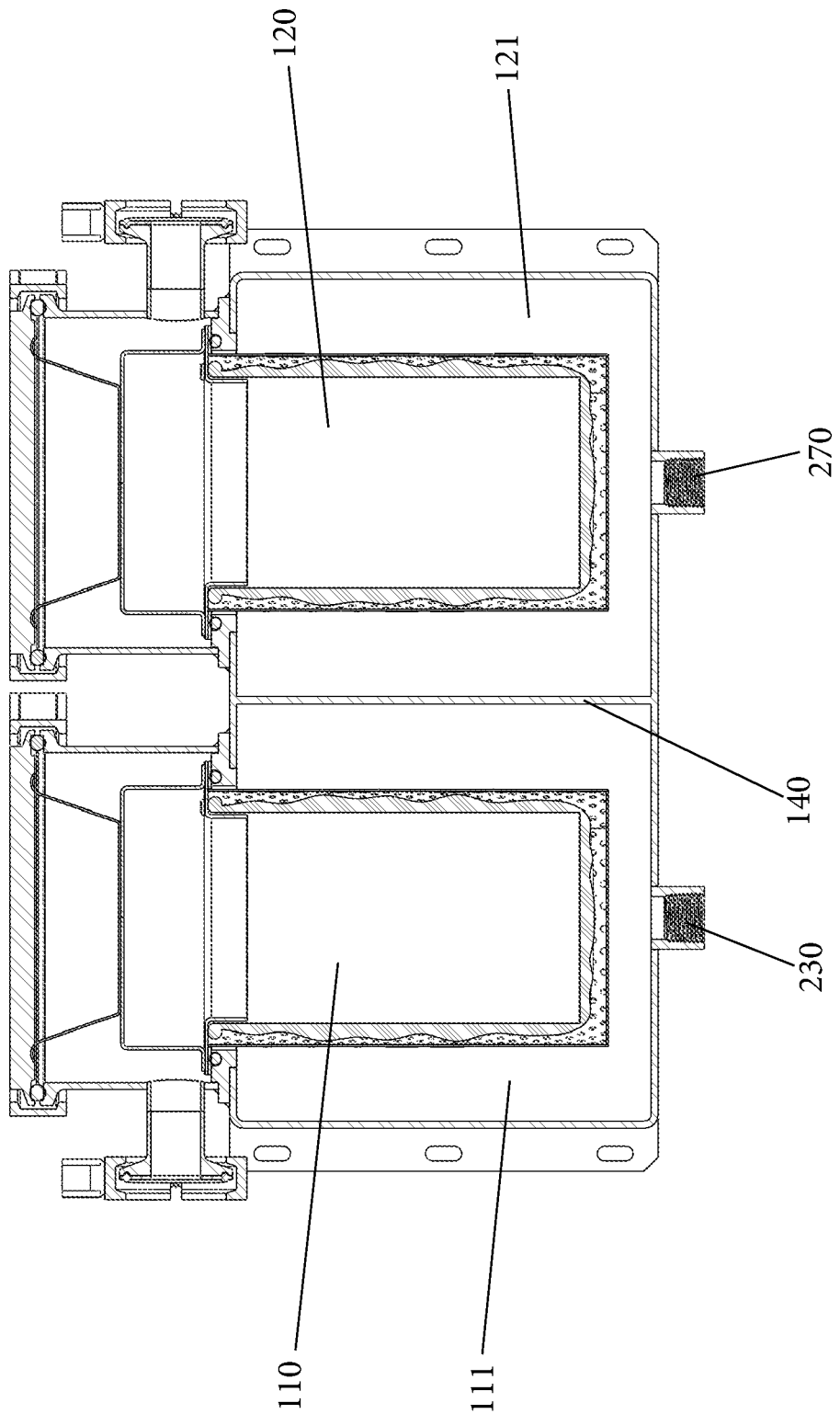
FIG. 8 is a cross-sectional view taken along the line A-A of FIG. 7.

The apparatus 100 includes a main housing 130 that contains both the first and second filter devices 110, 120. The main housing 130 can take any number of different shapes and sizes but is generally a walled structure that has a hollow interior. The main housing 130 thus includes a front wall 132, an opposing rear wall 133, a first side wall 134, an opposing second side wall 135, a bottom wall 136 and a top wall 137. As best shown in FIGS. 7 and 8, due to each of the first and second filter devices 110, 120 being independent from one another, the housing 110 further includes an interior dividing wall 140 that divides the hollow interior into a first compartment into which the first strainer device 110 is disposed and a second compartment into which the second strainer device 120 is disposed. As illustrated, the first and second compartments can be side-by-side in their orientation, thereby positioning the first and second filter devices 110, 120 in a side-by-side orientation.

In the illustrated embodiment, the first and second compartments are mirror images of one another and therefore, have the same area; however, it will be appreciated that the first and second compartments can be constructed so as to be different from one another in at least one measurement or property. For example, one of the first and second compartments can have increased dimensions, thereby resulting in it having a greater area relative to the other compartment.

Any number of different materials can be used to construct the apparatus 100, including the housing 110, so long as they are suitable for the intended application(s) described herein. For example, suitable materials including different metals, plastics, etc.

As shown in the figures, the first filter device 110 is intended for insertion into the first compartment and the second filter device 120 is intended for insertion into the second compartment. A first space 111 is formed around the first filter device 110 and the respective walls of the apparatus when the first filter device 110 is inserted into the first compartment and similarly, a second space 121 is formed around the second filter device 120 and the respective walls of the apparatus when the second filter device 120 is inserted into the second compartment. As described herein, these spaces 111, 121 contain recycled solvent stream that has passed through the respective first and second filter devices 110, 120 and thus, can be thought of as being filtered recycled solvent stream.

Figure 1:
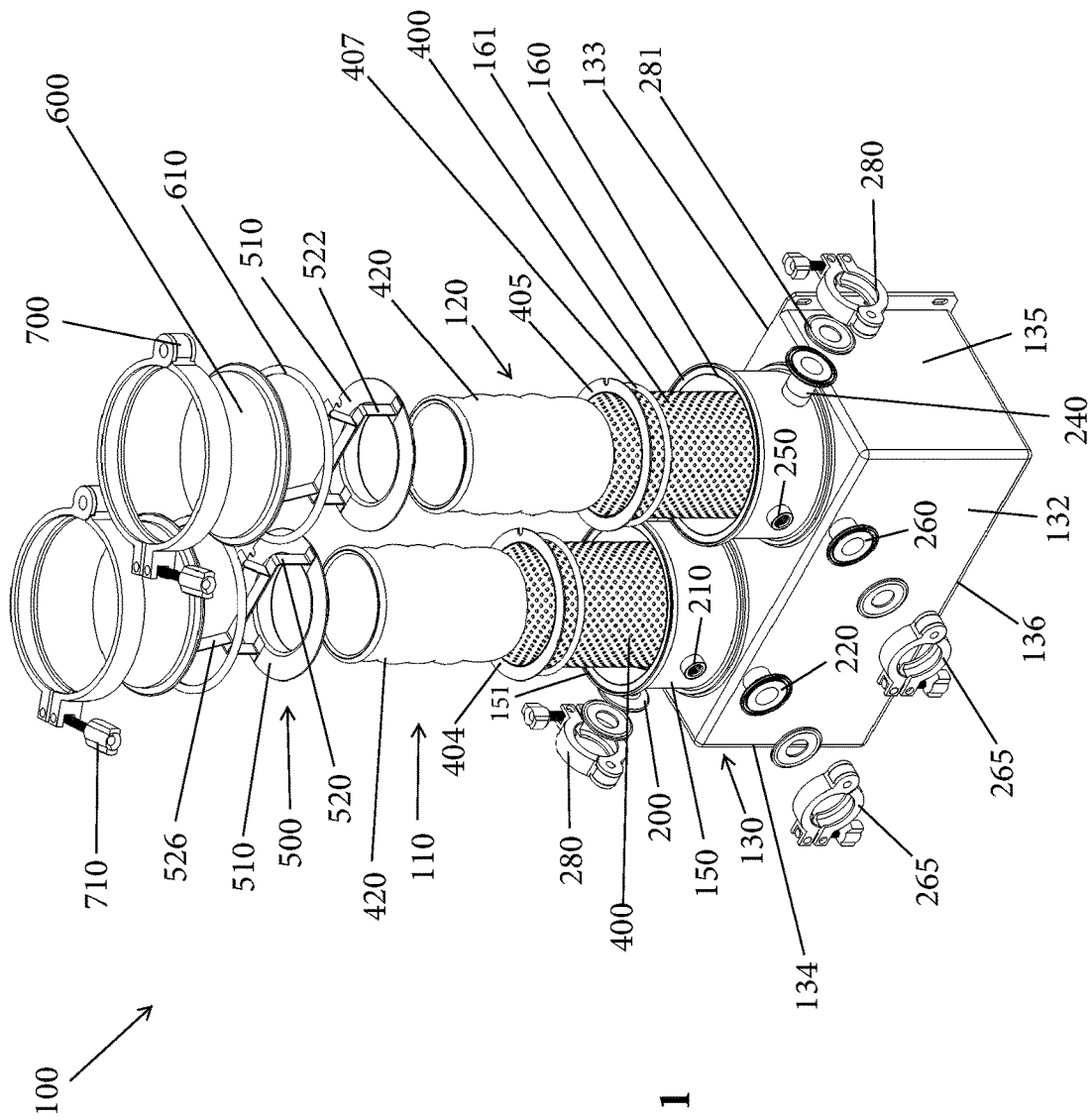
FIG. 1 is an exploded perspective view of an apparatus for filtering materials from post process MLO according to one implementation of the present invention.
Figure 2:
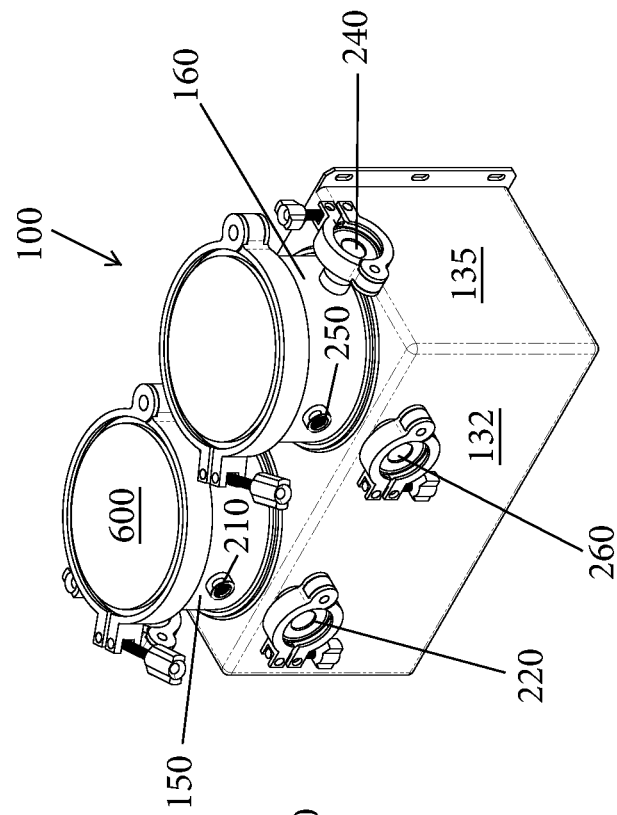
FIG. 2 is a top and size perspective view of the apparatus in an assembled state.

In the embodiment shown in FIG. 1, the main housing 110 includes a first upper housing 150 that extends upwardly from the top wall 137 and is associated with the first compartment and the first filter device 110 and a second upper housing 160 that extends upwardly from the top wall 137 and is associated with the second compartment and the second filter device 120. The top wall 137 includes a first opening (e.g., circular shaped opening) that forms an entrance into the first compartment from a hollow interior of the first upper housing 150 and similarly, includes a second opening (e.g., circular shaped opening) that forms an entrance into the second compartment from a hollow interior of the second upper housing 160. In one exemplary embodiment, each of the first and second upper housings 150, 160 has cylindrical shape and is tubular in construction. The first and second upper housings 150, 160 can be coupled to the top wall 137 using any number of techniques, including use of fasteners, bonding agents such as adhesives, welds, etc.

As illustrated, the first and second upper housings 150, 160 extend above the top wall 137 and, as described herein, provide locations in which the user inserts and removes the respective first and second filter devices 110, 120. The shape and size of each of the first and second upper housings 150, 160 are complementary to the corresponding first and second filter devices 110, 120 inserted therein and as illustrated, each of these components can have a cylindrical shape. At a top end thereof, the first upper housing 150 includes a flange or lip 151, and similarly, at the top end thereof, the second upper housing 160 includes a flange or lip 161.

The housing 110 is constructed such that each of the first and second compartments includes at least one fluid inlet for delivering the recycle solvent stream (or other fluid stream since apparatus 100 is not limited to being used in the manner described herein) and at least one fluid outlet for removing the recycle solvent stream after filtering by one of the first and second filter devices 110, 120.

For example, the first compartment can have a first (primary) inlet 200 and preferably also includes a second (secondary) inlet 210, along with an outlet 220, and a drain 230. Since the second compartment can be a mirror image of the first compartment, the second compartment also includes a first (primary) inlet 240 and preferably also includes a second (secondary) inlet 250, along with an outlet 260, and a drain 270. As mentioned herein, the set of inlets, outlet and drain associated with the first compartment are completely separated and independent from the set of inlets, outlet and drain associated with the second compartment.

The first inlet 200 is the inlet that receives the recycled solvent stream that includes the post MLO materials and the outlet 220 is the structure through which the filtered recycled solvent stream flows once it has been filtered by the respective filter device 110, 120. The secondary inlet 210 can be in the form of a purge port for receiving a rinsing agent (IPA or DI water) and drying medium (CDA or nitrogen). The drain 230 is a bottom drain through which the fluid contents of the first compartment can be evacuated as during maintenance, etc. The inlets 240, 250; outlet 260 and drain 270 of the second compartment serve similar functions and thus, will not be described in detail for sake of brevity.

The first inlet 200 and the second inlet 210 can be formed as part of the first upper housing 150 and in particular, can be angularly offset from one another. Each of the first and second inlets 200, 210 has a structure that extends radially outward from the first upper housing 150 and each is in fluid communication with the hollow interior of the first upper housing 150 by respective apertures formed in the first upper housing 150. While in the illustrated embodiment, the first and second inlets 200, 210 are approximately 45 degrees apart from one another, this orientation is merely exemplary and they can be positioned in different orientations with respect to one another. In addition, the dimensions of the first and second inlets 200, 210 can be the same, be similar or be different. For example, as shown, the first inlet 200 which is the main inlet can have greater dimensions (e.g., greater diameter) than the second inlet 210. Each of the first and second inlets 200, 210 is defined by a tubular structure that allows conduits, such as a flow lines, tubing, etc., to be attached thereto in a sealed manner so that fluids can be delivered into the hollow interior of the first upper housing 150.

The first (primary) inlet 240, second (secondary) inlet 250, the outlet 260, and the drain 270 associated with the second compartment can have similar structures and properties and thus, will not be described in detail for sake of brevity.

In the illustrated embodiment, the first inlets 200, 250 extend outwardly from opposite ends of the housing 110, while the second inlets 210, 260 extend outwardly from the front of the housing 110.

Each of the first inlets 200, 250 (as well as each of the second inlets 210, 260) can include a connector 280 to allow easy attachment of an inlet conduit carrying the feed stream (recycled solvent stream) to the inlet 200, 250. The connector 280 can be of a "quick connector" type and generally provides a sealed connection between conduit and inlet. A gasket 281 can be used with connector 280.

The outlet 220 of the first compartment and the outlet 260 of the second compartment provide an exit from the respective compartments and comprise structures which communicate with the respective compartment through a hole formed in the housing 110. In the illustrated embodiment, the outlet 220, 260 are positioned long the front wall 132 and in particular, are located in a top region of the front wall 132. As described herein, the outlets 220, 260 are positioned in an elevated region in the respective compartments so as to allow the filtered recycled solvent stream to fill the respective compartment after having been filtered by the respective filter device. In other words, the recycled solvent stream is conducted across filter media of the filter device and into one of spaces 111, 121 and initially, this filtered recycled solvent stream begins to fill the compartment until such time that the filtered recycled solvent stream reach a level of the outlet 220, 260. Once it reaches such level, the filtered recycled solvent stream freely flow out of the outlet 220, 260 (much like an overflow drain in a bath tub).

Figure 4:
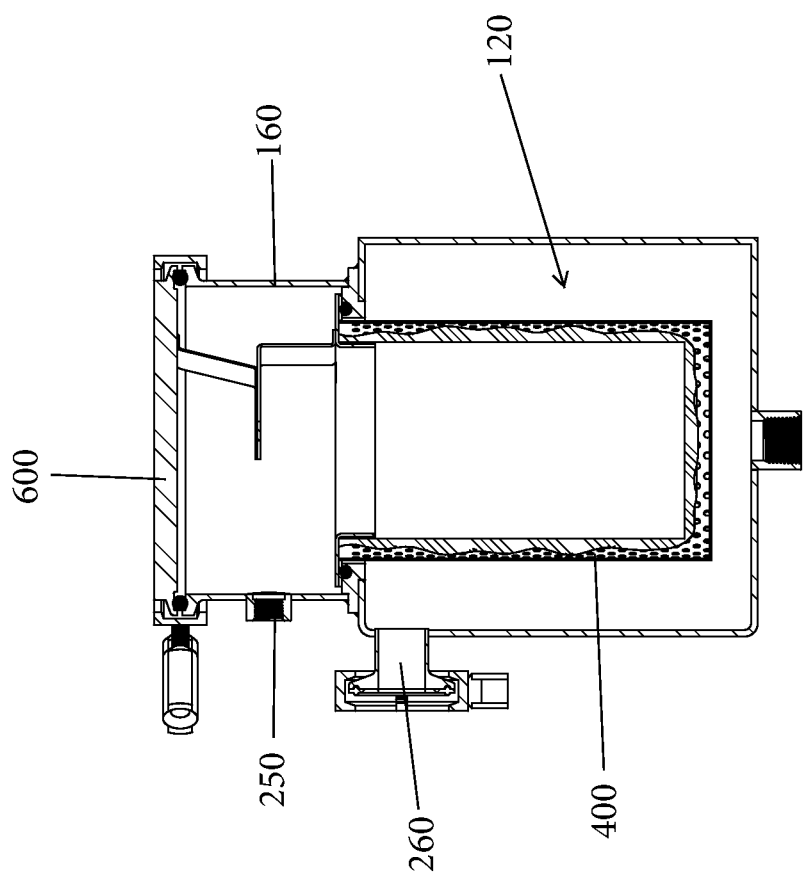
FIG. 4 is a cross-sectional view taken along the line A-A of FIG. 3.

As shown in FIGS. 4 and 5 and as described in more detail below, the outlet 220, 260 is formed at a position that is below the top of the respective filter device 110, 120. This positioning further ensures that the fluid that exits through the outlet is fluid that has been filtered by the respective filter device 110, 120.

In the illustrated embodiment, the second inlet is located directly above the outlet; however, this is only one implementation and the second inlet and outlet can be radially displaced from one another. As with the primary inlet, the outlet 220, 260 can include a connector 265, such as a quick connect type connector, that ensures a proper seal being an outlet conduit (tubing) that is attached to the outlet.

The first filter device 110 is intended to be placed and secured within the first compartment. The first filter device 110 includes a number of components that are assembled together as described below. More specifically, the first filter device 110 includes a first filter receptacle 400 that can be in the form of a perforated basket that has a closed bottom end 402 and an open top end 404. In the illustrated embodiment, the perforated basket 400 can have a cylindrical shape and the open top end 404 has an outwardly extending flange 405. The perforated basket 400 can thus be in the form of a metal or plastic basket that has a plurality of holes along its bottom wall and side wall to allow fluid to flow from the hollow interior of the basket 400 to the outside during normal operation of the device.

The flange 405 is designed to seat against the flange 151 of the first upper housing 150 and a first O-ring 407 can be disposed between the flanges 405, 151 to ensure a proper sealed fit between these components. When the first filter device 110 is in an inserted, in-use position, the seating of the flange 405 against the flange 151 results in the first filter device 110 being suspended in the first component in that the closed bottom end 402 is elevated and spaced from the bottom wall 136. In this in-use position, the inlet 200 is located above the open top end 404 and is positioned so that fluid flowing through the inlet 200 flows directly into the open top end of the perforated basket 400. The inlet 200 thus is positioned to cause the unfiltered recycled solvent stream to drop by gravity into the hollow interior of the perforated basket 400. Similarly, the secondary inlet 210 is also located above the first filter device 110 and therefore fluid flowing therethrough, such as a rinsing agent (IPA or DI water) and drying medium (CDA or nitrogen), enters the first compartment above the first filter device 110. As mentioned before, the outlet is positioned at a location that is below the open top end 404.

The holes in the perforated basket 400 are formed to have a selected size (diameter) that is selected in view of the nature of the post MLO materials. In other words, the basket 400 acts as a filter/strainer and thus, the holes are formed such that post MLP materials are captured within the hollow interior of the basket 400 and do not pass through the holes. The basket 400 can thus be thought of as having a mesh size (screen size) defined by the hole size. In one embodiment, the mesh size of the basket 400 is between about 25-150 µm; however, it will be appreciated that these values are only exemplary and therefore, other values are equally possible depending upon the material to be filtered.

The first filter device 110 also includes a removable filter media 420 that is disposed within the hollow interior of the perforated basket 400. The filter media 420 can be in the form of a bag having a closed bottom end and an open top end. The filter media 420 can thus resemble a sock. The material of the filter media 420 is constructed such that the recycled solvent stream can pass therethrough while the post MLO materials cannot pass therethrough, thereby resulting in filtering of the fluid. The filter media 400 can thus be thought of as being a mesh material defined by a mesh size. The mesh size of the filter media 420 is less than the mesh (screen) size of the basket 400 and thus is designed to filter small materials. In one embodiment, the mesh size of the filter media 420 is between about 2-40 μm; however, it will be appreciated that these values are only exemplary and therefore, other values are equally possible depending upon the material to be filtered.

The filter media 420 has a shape complementary to the basket 400 and in the illustrated embodiment, the filter media 420 can have a cylindrical shape.

By inserting the filter media 420 into the basket 400 and causing the unfiltered recycled solvent stream to flow into the hollow interior of the combined filter media 420/basket 400 structure, the stream undergoes two different filtration processes, namely, passing through the finer filter media 420 and then passing through the holes in the basket 400. Once the filter flows through the holes in the basket 400, the filtered solvent stream then passes into space 111 and as described herein, the continued operation of the first filter device 110 results in an increasing level of filtered solvent stream in the space 111 until the fluid level reaches the outlet through which the filtered solvent stream exits the housing 110 and flows to another location (e.g., a fluid recycling location).

It will also be appreciated that the filtration characteristics of each of the basket 400 and the filter media 420 can easily be changed since the two are independent, separable parts and also, both of these parts can easily be removed from the housing 110, thereby permitting easy substitution thereof. In other words, depending upon the characteristics of the post process MLO solvent, the proper basket 400 and filter media 420 can be selected amongst a set of baskets 400 and a set of filter media 420. More specifically, a basket 400 and filter media 420 with desired mesh size (screen size) are selected in view of the MLO materials that are to be removed (i.e., in view of the type and size of the MLO materials).

The first filter device 110 includes a cover assembly for covering the first filter device 110 in a sealed manner. The cover assembly can includes a retainer member 500 that performs several different functions. First, the retainer member 500 provides a means for ensuring that the filter media 420 is held in place and more particularly, the open top end (which can include a flange) is nested between the retainer member 500 and the flange of the first upper housing 150. As illustrated, the retainer member 500 includes an annular shaped bottom portion that is sized to be received within the hollow interior of the filter media 420. The retainer member 500 also includes an outwardly extending flange member 510 that in combination with the flange of the first upper housing 150 serves to sandwich the lip (flange) of the filter media resulting in the filter media being held securely in place.

The retainer member 500 also includes a goal post type structure 520 defined by a pair of spaced bottom legs 522, a cross member extending between the bottom legs 522 and a pair of upper legs 526 that can be in the form of flexible prongs. The bottom legs 522 are secured to flange 510 at two spaced locations (e.g., 180 degrees apart). The upper legs 526 can be angled relative to one another as shown. A second function of the retainer member 500 is that the structure 520 is designed as a locating feature that ensures that a cover 600 (described below) is properly seated (thereby ensuring a sealed first chamber).

The cover 600 is configured to seal the first chamber and more particularly, seals the first upper housing 150. The cover 600 can be disk shaped and a bottom region thereof can have a greater diameter than a top region so as to define a stepped construction as shown. A second O-ring 610 is provided between the cover 600 and the flange 510 of the retainer member 500.

The cover assembly also includes a cover clamp 700 that ensures that the cover (lid) 600 is securely held in place. The cover clamp 700 can be an annular shaped structure that is received about the periphery of the cover 600 and includes a means for tightening the clamp 700, such as a thumb screw 710.

The second filter device 120 includes the same components of the first filter device 110 and therefore, like parts are numbered alike.

The cover assembly thus offers an efficient and convenient way to access one of the first and second compartments and more particularly, to access one of the first and second filter devices 110, 120 for performing maintenance thereof.

In particular, during normal operation the recycled solvent stream that is to be cleaned is connected to one or more of the first and second filter devices 110, 120 by being fluidly connected to the primary inlets 200, 240.

In one implementation, a wye connector can be used so that the source of recycled solvent stream to be filtered is connected to both of the primary inlets 200, 240 with a valve being used to selectively control flow of the solvent stream to one of the primary inlets 200, 240.

After a period of operation, the filter device 110, 120 that has been operating is brought offline by first diverting the unfiltered recycled solvent stream to the other of the filter device 110, 120 which is placed into an active filtration mode. Then the drain of the filter device that is brought offline is opened to cause a draining of the respective compartment. Once the compartment is fully drained, the filter device 110, 120 can be removed by first releasing and removing the associated cover assembly. Once the cover assembly is removed, the combined perforated basket 400 and removable filter media 420 are removed from the compartment to allow for maintenance and cleaning thereof. Once the maintenance is done, the cleaned basket 400 and filter media 420 are then inserted back into the respective filter device and are thus in a standby mode and ready to perform filtering when the other filter device is brought offline for cleaning thereof.

The apparatus 100 offers a number of advantages including but not limited to the following. The provision of dual filtration devices defined by two strainers (baskets 400) and two filter media (bag filters) provides the following features: (A) strainer: twice capacity for metals (double life); tandem design has smaller footprint; rinse\dry eliminates solvent exposure of personnel; tandem strainers mean downtime eliminated; strainer\filter indexer ensures proper alignment; and (B) bag filter: decreases effective mesh size; permits changing pore size of bag filter, increases collection efficiency; makes maintenance easier by reducing magnitude of strainer cleaning, increases downstream filter life.

One skilled in the art will appreciate further features and advantages of the invention based on the above-described embodiments. Accordingly, the invention is not to be limited by what has been particularly shown and described, except as indicated by the appended claims. All publications and references cited herein are expressly incorporated herein by reference in their entirety.

What is claimed is:

1. An apparatus for filtering post process MLO (Material Lift Off) solvent comprising:
   a housing including an inner dividing wall that divides a
      hollow interior of the housing into a first compartment and a second compartment that is completely isolated from the first compartment;

a first filter device removably disposed in the first compartment;

a second filter device removably disposed in the second compartment and being completely independent from the first filter device;

a first inlet that is in fluid communication with the first compartment and positioned such that unfiltered post process MLO solvent flows into an interior of the first filter device and a first outlet that is in fluid communication with the first compartment at a location exterior to the first filter device for receiving filtered post process MLO; and a second inlet that is in fluid communication with the second compartment and positioned such that unfiltered post process MLO solvent flows into an interior of the second filter device and a second outlet that is in fluid communication with the second compartment at a location exterior to the second filter device for receiving filtered post process MLO solvent;

wherein the apparatus is configured such that one of the first and second filter devices can be in an online, operating state, while the other of the first and second filter devices can be in an offline state.

2. The apparatus of claim 1, wherein the housing is defined by front and rear walls, top and bottom walls and first and second side walls with the inner dividing wall extending between and in sealed relationship to the front and rear walls and extending between an in sealed relationship to the top and bottom walls.

3. The apparatus of claim 2, wherein there is a first space formed in the first compartment surrounding the first filter device, the first inlet and first outlet being in fluid communication with the first space and there is a second space formed in the second compartment surrounding the second filter device, the second inlet and second outlet being in fluid communication with the second space.

4. The apparatus of claim 3, wherein the unfiltered post process MLO solvent is filtered by being conducted across the first filter device from the interior thereof to the exterior thereof.

5. The apparatus of claim 1, wherein the housing includes a first upper housing that protrudes above the top wall and a second upper housing that protrudes above the top wall.

6. The apparatus of claim 1, wherein the first outlet is formed at a location that is below the first inlet and is located below an open top end of the first filter device.

7. The apparatus of claim 1, wherein the first filter device comprises an outer perforated strainer body that has a hollow interior and an inner filter media that is disposed within the hollow interior of the outer perforated strainer body.

8. The apparatus of claim 7, wherein the inner filter media comprises a filter bag having a closed bottom end and an open top end.

9. The apparatus of claim 8, wherein the filter bag has a mesh size different from a mesh size of the outer perforated strainer body.

10. The apparatus of claim 8, wherein the filter bag has a smaller mesh size than the outer perforated strainer body.

11. The apparatus of claim 8, further including a first cover assembly for sealing the first filter device in the first compartment and a second cover assembly for sealing the second filter device in the second compartment, wherein the first outer perforated strainer body has a flange member at an open top end thereof, the first filter bag being nested between the flange member of the first outer perforated strainer body and a cover flange member associated with the first cover assembly.

12. The apparatus of claim 11, wherein the first cover assembly includes a retainer member that includes the cover flange member and the first filter bag is captured between the flange member of the first outer perforated strainer body and the cover flange member.

13. The apparatus of claim 12, wherein the retainer member includes a pair of upstanding members that are configured to force a lid of the first cover assembly to seat properly.

14. A system for filtering post process MLO solvent comprising:

a source of post process MLO (Material Lift Off) solvent;

a dual filter apparatus that is fluidly connected to the source, the dual filter apparatus including:

a housing including an inner dividing wall that divides a hollow interior of the housing into a first compartment and a second compartment that is completely isolated from the first compartment;

a first filter device removably disposed in the first compartment, the first filter device including a first hollow perforated outer filter body and first filter media disposed within a hollow interior of the first perforated outer filter body;

a second filter device removably disposed in the second compartment and being completely independent from the first filter device, the second filter device including a second hollow perforated outer filter body and second filter media disposed within a hollow interior of the second perforated outer filter body;

a first inlet that is in fluid communication with the first compartment and positioned such that the post process MLO solvent flows into an interior of the first filter media and a first outlet that is in fluid communication with the first compartment at a location exterior to the first filter device for receiving filtered post process MLO solvent that has been conducted across the first filter media and the first perforated outer filter body; and a second inlet that is in fluid communication with the second compartment and positioned such that post process MLO solvent flows into an interior of the second filter media and a second outlet that is in fluid communication with the second compartment at a location exterior to the second filter device for receiving filtered post process MLO solvent that has been conducted across the second filter media and the second perforated outer filter body;

wherein the apparatus is configured such that one of the first and second filter devices can be in an online, operating state, while the other of the first and second filter devices can be in an offline state.

15. The system of claim 14, wherein each of the first and second perforated outer filter body comprises a perforated strainer body that has a hollow interior and is perforated along a bottom wall and side wall thereof.

16. The system of claim 15, wherein each of the first and second filter media comprises a filter bag having a closed bottom end and an open top end.

17. The system of claim 16, wherein the filter bag has a mesh size different from a mesh size of the outer perforated strainer body.

18. The system of claim 16, wherein the filter bag has a smaller mesh size than the outer perforated strainer body.

19. The system of claim 16, wherein the open top end of the filter bag includes a lip that seats against a flange at the strainer body and a lid that closes off the filter bag and the perforated outer filter body is at least partially inserted into the open top end of the filter bag.

20. An apparatus for filtering post process MLO solvent comprising:

a housing including an inner dividing wall that divides a hollow interior of the housing into a first compartment and a second compartment that is completely isolated from the first compartment;

a first filter device removably disposed in the first compartment, the first filter device including a first hollow perforated outer filter body and first filter bag disposed within a hollow interior of the first perforated outer filter body;

a second filter device removably disposed in the second compartment and being completely independent from the first filter device, the second filter device including a second hollow perforated outer filter body and second filter bag disposed within a hollow interior of the second perforated outer filter body;

a first inlet that is in fluid communication with the first compartment and positioned such that the post process MLO solvent flows into an interior of the first filter media and a first outlet that is in fluid communication with the first compartment at a location exterior to the first filter device for receiving filtered post process MLO solvent that has been conducted across the first filter media and the first perforated outer filter body; and a second inlet that is in fluid communication with the second compartment and positioned such that post process MLO solvent flows into an interior of the second filter media and a second outlet that is in fluid communication with the second compartment at a location exterior to the second filter device for receiving filtered post process MLO solvent that has been conducted across the second filter media and the second perforated outer filter body;

wherein the apparatus is configured such that one of the first and second filter devices can be in an online, operating state, while the other of the first and second filter devices can be in an offline state.

* * * * *